(12) United States Patent
Jung et al.

(10) Patent No.: US 6,377,532 B1
(45) Date of Patent: Apr. 23, 2002

(54) RUN-LENGTH LIMITED ENCODING METHOD AND APPARATUS FOR USE IN A HIGH DENSITY OPTICAL STORAGE SYSTEM

(75) Inventors: Heung Sang Jung; Mun Ho Han; Se Hyung Yong; Jaejin Lee, all of Seoul (KR)

(73) Assignee: Daewoo Electronics Co., Ltd. (KR)

(*) Notice: Subject to any disclaimer, the term of this patent is extended or adjusted under 35 U.S.C. 154(b) by 0 days.

(21) Appl. No.: 09/718,218

(22) Filed: Nov. 21, 2000

(51) Int. Cl.[7] .................................................. G11B 7/00

(52) U.S. Cl. ........................ 369/59.23; 369/59.24; 369/47.1; 341/59

(58) Field of Search ................. 369/47.1, 47.2, 369/47.21, 53.1, 59.1, 59.11, 59.13, 59.23, 59.24, 59.27; 341/59, 58

(56) References Cited

U.S. PATENT DOCUMENTS

| | | | | |
|---|---|---|---|---|
| 5,165,089 A | * | 11/1992 | Jaquette et al. ............ | 369/59.2 |
| 5,563,864 A | * | 10/1996 | Kobayashi et al. ...... | 369/59.22 |
| 6,188,336 B1 | * | 2/2001 | Kim ............................ | 341/59 |
| 6,241,778 B1 | * | 5/2001 | De Lind van Wijngaarden et al. ........ | 341/58 |

* cited by examiner

Primary Examiner—Muhammad Edun
(74) Attorney, Agent, or Firm—Anderson Kill & Olick, PC

(57) ABSTRACT

In a run-length limited encoding method used in an optical data storage system for encoding input data of two bits into corresponding output data of five bits, a minimum run-length of zeroes (0's) in a stream of the output data is 3; a maximum run-length of zeroes (0's) in the stream of the output data is 11; and the number of 1 included in binary numbers of five bits expressing the corresponding output data is 1 or 0. In the encoding method, the input data of two bits is one of "00", "01", "10" and "11"; and the corresponding output data is one of "10000", "01000", "00100" and "00010".

10 Claims, 3 Drawing Sheets

US 6,377,532 B1

RUN-LENGTH LIMITED ENCODING METHOD AND APPARATUS FOR USE IN A HIGH DENSITY OPTICAL STORAGE SYSTEM

FIELD OF THE INVENTION

The present invention relates to a high density optical storage system; and, more particularly, to a run-length limited encoding method and apparatus for use in a high density optical data storage system.

BACKGROUND OF THE INVENTION

Currently, a compact disc (CD) and a digital versatile disc (DVD) are two most popular optical recording media. When transmitting or recording data on such a recording medium, the data are modulated so as to be suited for transmission or recording. Block coding has been known as one of such modulation techniques. A code produced by block coding is termed as a variable length code (d,k;m,n;r), wherein d is a minimum number of same consecutive symbols, representing a minimum run-length of zeroes (0's); k is a maximum number of same consecutive symbols, indicating a maximum run-length of zeroes (0's); m represents input bit information; n is a modulated code word; and r represents a maximum constraint length.

When recording a variable length code on, for example, an optical disc, it is modulated into a so-called non-return to zero (NRZ) code and recorded based upon the NRZ modulated variable length code, referred to hereinafter as a recording waveform data string.

With a minimum length $T_{min}$ between transitions of the recording waveform data strings and a maximum length $T_{max}$ between transitions thereof, it is desirable from the viewpoint of the recording density that $T_{min}$ be long, i.e., the minimum run-length d be large while it is desirable from the viewpoint of the clock reproduction and jitter that $T_{max}$ be short, i.e., the maximum run-length k be small. A variety of modulation methods have been proposed to satisfy the above conditions. It should be noted that the $T_{min}$, being fixed by the nature of the laser beam, can be referred to as a minimum mark length since the optical recording is dependent on the laser beam and there is a physical limit in the size (or length) of the laser beam spot.

Conventionally, the modulation code for a CD and that for a DVD are a so-called eight-to-fourteen modulation (EFM) code and an EFMPlus code, respectively. Both of the EFM code and the EFMPlus code have a minimum run-length constraint d=2 to reduce intersymbol interference (ISI) and a maximum run-length constraint k=10 to recover a timing signal.

The EFM code encodes 8 bit input data to a 14 bit output code word. There are 256 code words corresponding to 256 input patterns of 1 byte. In addition to this, it is necessary to use 3 merging bits between code words in order to suppress direct current (DC) content of the encoded channel bit sequence. Thus, the overall coding ratio of the EFM code is 8/17.

Meanwhile, EFMPlus code, which is an advanced version of EFM code, encodes 8 bit input data to a 16 bit code word. This code utilizes a supplementary code table to suppress DC content of a channel bit sequence in addition to a main code word mapping table. Thus, a code word is selected from these two tables depending on a running digital sum (RDS) thereof. Therefore, the overall coding ratio of the EFMPlus code, which is 8/16, is larger than that of the EFM code, i.e., 8/17. The density ratio of the EFM code and that of the EFMPlus code are 1.41 and 1.5, respectively, wherein the density ratio is defined as DR=(1+d)R, R being the coding ratio.

Conventionally, in recording run-length limited (RLL) modulated code words with the minimum run-length d=2 by employing the EFM code, code words of 3T are recorded within $T_{min}$ ($T_{min}$ is fixed), 1T being the recording length of one channel bit. Therefore, the conventional modulation codes have limitations on increasing the data recording density. For example, in a standard for 2.5 Gbyte DVD-RAM, $T_{min}$ (=3T) is 0.614 μm; accordingly, the length of one channel bit corresponds to 0.205 μm (=(0.614 μm)/3) and the user data bit becomes 0.409 μm to satisfy the coding ratio 8/16. In other words, for recording the user data of 1 byte (=8 bits), channel bits of 3.28 μm(=16×0.205 μm) are needed since the coding ratio is 8/16.

In view of the foregoing, it is necessary to provide a new RLL encoding method to increase a data recording density thereof by further decreasing the channel bit length in comparison with the conventional RLL encoding method employing an EFM or EFMPlus code.

SUMMARY OF THE INVENTION

It is, therefore, a primary object of the present invention to provide a run-length limited (RLL) encoding method and apparatus to increase a data recording density thereof for use in a high density optical storage system.

It is another object of the present invention to provide a run-length limited (RLL) decoding method and apparatus for use in a high density optical storage system.

In accordance with one aspect of the present invention, there is provided a run-length limited (RLL) encoding method used in an optical data storage system for encoding an input data of two bits into a corresponding output data $O_4O_3O_2O_1O_0$ of five bits, wherein a minimum run-length of zeroes (0's) in a stream of the output data is 3;

a maximum run-length of zeroes (0's) in the stream of the output data is 11; and the number of 1 included in binary numbers of five bits expressing the corresponding output data is 1 or 0.

In accordance with another aspect of the present invention, there is provided a run-length limited (RLL) encoding apparatus used in an optical data storage system for encoding a current input data $C_1C_0$ of two bits into a corresponding current output data $O_4O_3O_2O_1O_0$ of five bits, comprising:

a first shift register for storing updated next input data of two bits inputted thereto in response to a predetermined clock signal CLK and for providing data of two bits previously stored therein as next input data $N_1N_0$ of two bits;

a first delay circuit for delaying the next input data $N_1N_0$ to thereby generate updated current input data;

a second shift register for storing the updated current input data inputted thereto and for providing data of two bits previously stored therein as current input data $C_1C_0$ of two bits;

a second delay circuit for delaying the current input data $C_1C_0$ of two bits to thereby generate updated past input data;

a third shift register for storing the updated past input data inputted thereto and for providing data of two bits previously stored therein as past input data $P_1P_0$ of two bits;

an encoding circuit for encoding the current input data $C_1C_0$ of two bits into corresponding current output data $O_4O_3O_2O_1O_0$ of five bits by using the past input data $P_1P_0$, the current input data $C_1C_0$ and the next input data $N_1N_0$, wherein a minimum run-length of zeroes (0's) in a stream of the output data is 3; a maximum run-length of zeroes (0's) in the stream of the output data is 11; and the number of 1 included in binary numbers of five bits expressing the output data is 1 or 0;

a divider for dividing the predetermined clock signal CLK by 2 to thereby provide a five bit data output clock signal; and a data output buffer circuit, in response to the five bit data output clock signal, for generating the corresponding output data $O_4O_3O_2O_1O_0$ of five bits.

BRIEF DESCRIPTION OF THE DRAWINGS

The above and other objects and features of the present invention will become apparent from the following description of preferred embodiments given with reference to the accompanying drawings, in which.

DETAILED DESCRIPTION OF THE PREFERRED EMBODIMENTS

Figure 1:
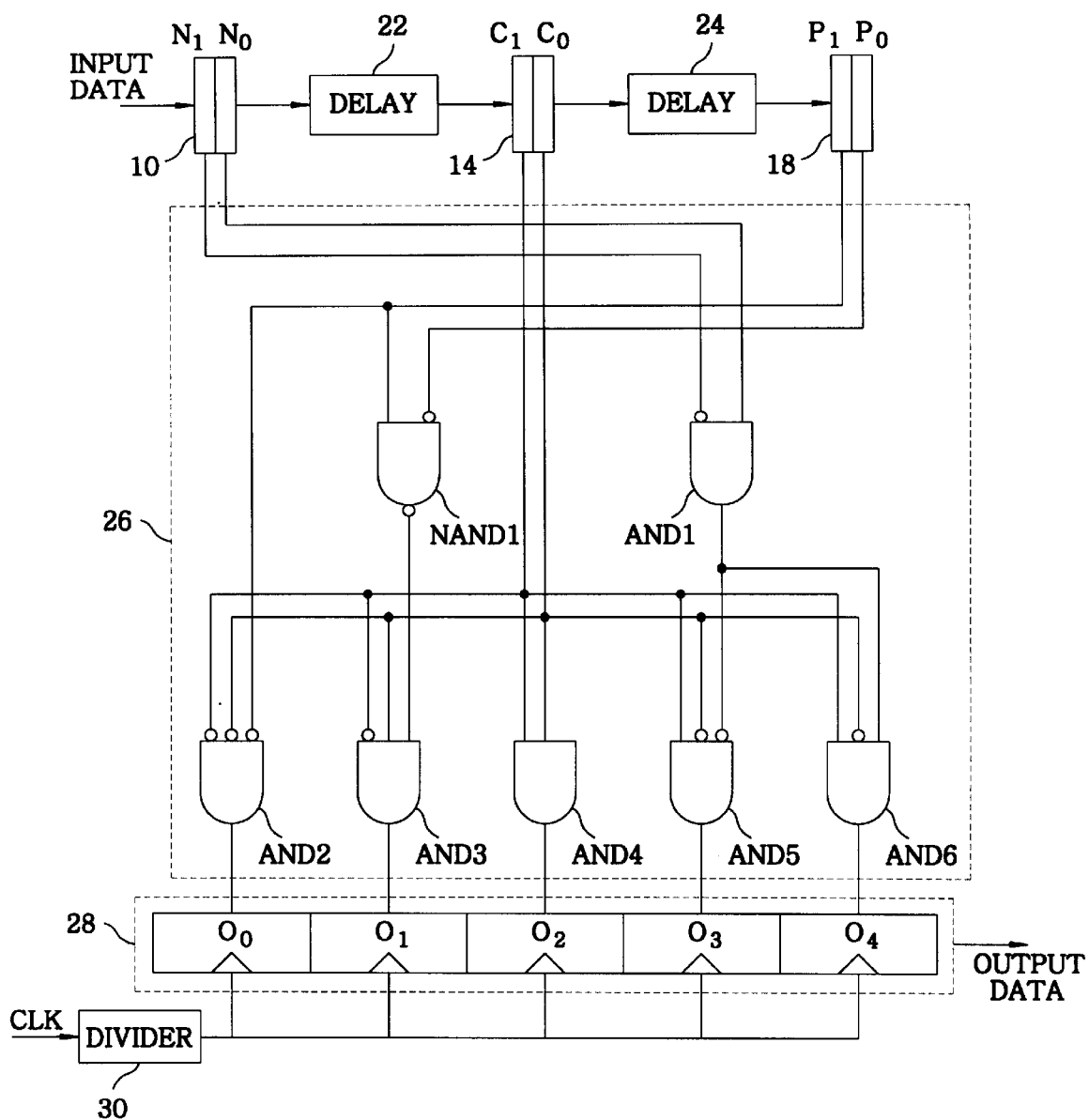
FIG. 1 illustrates a circuit diagram of a run-length limited (RLL) encoding apparatus used in an optical data storage system for encoding input data of two bits into corresponding output data of five bits in accordance with a preferred embodiment of the present invention.

In accordance with of the present invention, there is provided a run-length limited (RLL) encoding method used in an optical data storage system for encoding input data of two bits into corresponding output data of five bits. In the method, a minimum run-length of zeroes (0's) in a stream of the output data is 3 (i.e., d=3); a maximum run-length of zeroes (0's) in the stream of the output data is 11 (i.e., k=11); and the number of 1 included in binary numbers of five bits expressing the corresponding output data for the input data is 1 or 0. In the method, the coding ratio is 0.4 (=2/5). Accordingly, the coding ratio of the method of the present invention becomes smaller than that of the case employing the conventional EFM or EFMPlus code.

Further, in the method of the present invention, the minimum mark length $T_{min}$ (=0.614 μm) corresponds to 4T since d=3, while $T_{min}$ corresponds to 3T in the method using the standard 2.6 Gbyte DVD-RAM since d=2. Accordingly, the length T of one channel bit in the method of the present invention becomes 0.154 μm(=0.614 μm/4) while that of the method using the standard 2.6 Gbyte DVD-RAM is 0.205 μm(=0.614 μm/3). Hence, in the method of the present invention, for recording the user data of 1 byte (=8 bits), channel bits of 3.08 μm(=8×(5/2)×0.154 μm) are needed since the coding ratio is 2/5.

In the conventional method employing the standard 2.6 Gbyte DVD-RAM, the channel bits of 3.28 μm (=8×(16/8)×0.205 μm) are needed for recording the user data of 1 byte (=8 bits) since the coding ratio is 8/16.

As a result, the present invention can save the recording length of 0.2 μm per 1 byte of user data. Namely, the length to record input data of one channel bit in accordance with the present invention is shortened by 0.2 μm, thereby enhancing the recording density thereof.

In accordance with a preferred embodiment of the present invention, input data of "00", "01", "10" and "11 " are encoded into the corresponding output data of "10000", "01000", "00100" and "00010", respectively. This encoding rule is expressed in the following Table 1.

TABLE 1

| Input data bits | Output data bits (code words) |
|---|---|
| 00 | 10000 |
| 01 | 01000 |
| 10 | 00100 |
| 11 | 00010 |

In this case, to satisfy the condition of k=11, if a pair of consecutive two input data is "1000", a pair of corresponding two output data is determined as "0010000000"; if a pair of consecutive two input data is "1100", a pair of corresponding two output data is determined as "0001000000"; and if a pair of consecutive two input data is "1101", a pair of corresponding two output data is determined as "0000100000". This supplementary encoding rule is expressed in the following Table 2.

TABLE 2

| Input data bits | Output data bits (code words) |
|---|---|
| 1000 | 0010000000 |
| 1100 | 0001000000 |
| 1101 | 0000100000 |

In the present invention having the condition of d=3 and k=11, as listed in the following table 3, the recording density is enhanced in comparison with the conventional methods.

TABLE 3

| | (d,k) | R (Coding Ratio) | DR (Density Ratio) (DR = (1 + d)R) |
|---|---|---|---|
| Conventional Methods | (1, 7) | 2/3 | 1.33 |
| | (2, 10) | 8/17 (EFM) | 1.41 |
| | | 8/16 (EFMPlus) | 1.50 |
| Present Method | (3, 11) | 2/5 | 1.60 |

Based on the code word mapping rule as represented in tables 1 and 2, corresponding encoding apparatus and decoding apparatus can be designed.

Referring to FIG. 1, there is illustrated a circuit diagram of an RLL encoding apparatus 100 used in an optical data storage system for encoding input data of two bits into corresponding output data of five bits by employing the encoding method described above in accordance with a preferred embodiment of the present invention. The encoding apparatus 100 includes shift registers 10, 14 and 18; delay circuits 22 and 24; an encoding circuit 26; a data output buffer 28; and a clock signal divider 30.

The shift register 10 stores updated next input data of two bits inputted thereto in response to a predetermined clock signal CLK and provides data of two bits previously stored therein as next input data $N_1N_0$ of two bits to the first delay circuit 22 and the encoding circuit 26. The first delay circuit 22 delays the next input data $N_1N_0$ to thereby generate updated current input data.

The shift register 14 stores the updated current input data inputted thereto from the first delay circuit 22 and provides data of two bits previously stored therein as current input data $C_1C_0$ of two bits to the second delay circuit 24 and the encoding circuit 26.

The second delay circuit 24 delays the current input data $C_1C_0$ of two bits to thereby generate updated past input data. The shift register 18 stores the updated past input data inputted thereto from the second delay circuit 24 and provides data of two bits previously stored therein as past input data $P_1P_0$ of two bits to the encoding circuit 26.

It should be noted that the subscript indices attached to the characters N, C and P express data transmission and processing sequences thereof. A binary bit having a smaller subscript index is transmitted and processed earlier than or simultaneously with one having a greater subscript index. For example, $N_0$ is transmitted and processed earlier than or simultaneously with $N_1$.

The encoding circuit 26 encodes the current input data $C_1C_0$ into corresponding current output data $O_4O_3O_2O_1O_0$ of five bits by using the past input data $P_1P_0$, the current input data $C_1C_0$ and the next input data $N_1N_0$, wherein a minimum run-length of zeroes (0's) in a stream of the output data is 3; a maximum run-length of zeroes (0's) in the stream of the output data is 11; and the number of 1 included in binary numbers of five bits expressing the output data is 1 or 0.

In detail, the encoding circuit 26 has one NAND gate NAND1 and six AND gates AND1, AND2, AND3, AND4, AND5 and AND6 as illustrated in FIG. 1. The NAND gate NAND1 executes NAND operation on $P_1$ and an inverted value of $P_0$. The AND gate AND1 performs AND operation on $N_0$ and an inverted value of $N_1$. The AND gate AND2 carries out AND operation on inverted values of $P_1$, $C_1$ and $C_0$. The AND gate AND3 executes AND operation on $C_0$, an inverted value of $C_1$ and an inverted value of an output of the NAND gate NAND1. The AND gate AND4 performs AND operation on $C_1$ and $C_0$. The AND gate AND5 executes AND operation on $C_1$, an inverted value of $C_0$ and an inverted value of an output of the AND gate AND1. The AND gate AND6 performs AND operation on $C_1$, an output value of AND gate AND1 and an inverted value of $C_0$. The outputs from the five AND gates of AND2, AND3, AND4, AND5 and AND6 are registered in corresponding memory locations relating to output binary values of $O_0$, $O_1$, $O_2$, $O_3$ and $O_4$, respectively, of the data output buffer 28 as illustrated in FIG. 1.

It should be also noted that subscript indices attached to the character O express data transmission and processing sequences thereof. A binary bit having a smaller subscript index is transmitted and processed earlier than or simultaneously with one having a greater subscript index. For example, $O_0$ is transmitted and processed earlier than or simultaneously with $O_1$.

The data output buffer 28, in response to a first data output clock signal fed thereto from the divider 30, generates corresponding output data $O_0O_1O_2O_3O_4$ of five bits, wherein the first data output clock signal is obtained by dividing the predetermined clock signal CLK by 2 through the divider 30.

In the coding apparatus 100, $O_0=1$ if $C_1C_0=00$ and $P_1$ is not 1; and $O_0=0$ if otherwise. For $O_1$, $O_1=1$ if $C_1C_0=01$ and $P_1P_0$ is not 10; and $O_1=0$ if otherwise. For $O_2$, $O_2=1$ if $C_1C_0=11$; and $O_2=0$ if otherwise. For $O_3$, $O_3=1$ if $C_1C_0=10$ and $N_1N_0$ is not 01; and $O_3=0$ if otherwise. For $O_4$, $O_4=1$ if $C_1C_0=10$ and $N_1N_0=01$; and $O_4=0$ if otherwise.

Figure 2:
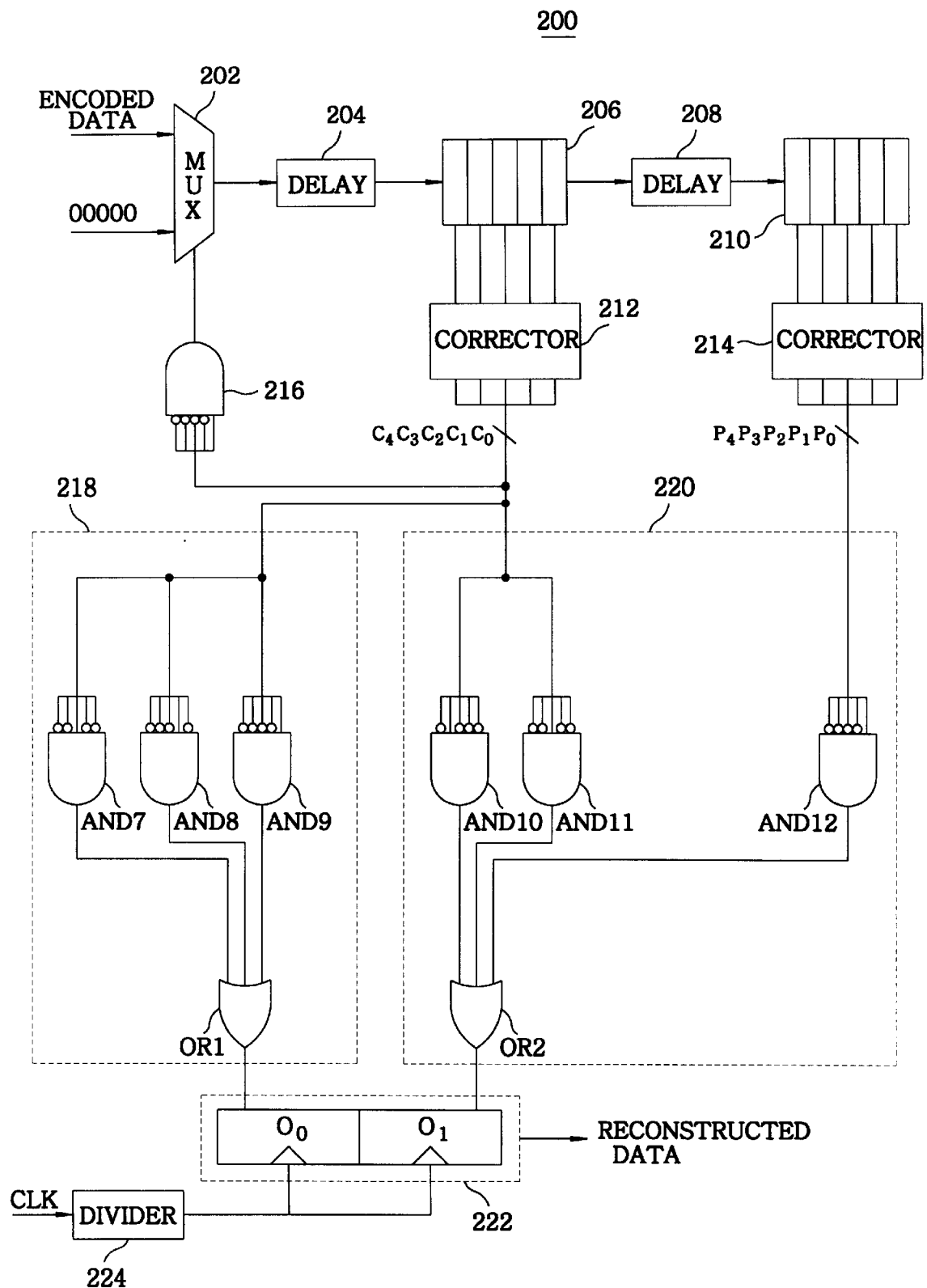
FIG. 2 shows a circuit diagram of an RLL decoding apparatus used in an optical data storage system for decoding the encoded data of five bits into corresponding reconstructed data of two bits in accordance with the preferred embodiment of the present invention.

Referring to FIG. 2, there is shown a circuit diagram of an RLL decoding apparatus 200 used in an optical data storage system for decoding the encoded data, e.g., current encoded data, of five bits into corresponding reconstructed data of two bits in accordance with a preferred embodiment of the present invention. It should be noted that the encoded data of five bits have been encoded by employing the encoding method of the present invention as described above and then have been fed to the decoding apparatus 200 through a transmission channel.

The decoding apparatus 200 includes a multiplexer (MUX) 202; shift registers 206 and 210; delay circuits 204 and 208; correctors 212 and 214; a control gate 216; a first decoding circuit 218; a second decoding circuit 220; a data output buffer 222; and a divider 224.

Encoded data, e.g., the output data $O_0O_1O_2O_3O_4$ of five bits transmitted thereto through a transmission channel (not shown) from the encoding apparatus 100, is fed to one input terminal of the MUX 202 as current encoded data. A predetermined correction data bit, e.g., "00000" is fed to the other input terminal of the MUX 202. The MUX 202, in response to a preset control signal from the control gate 216, performs multiplexing on the encoded data of five bits and the predetermined correction data bit of "00000" to thereby provide one of the encoded data of five bits and the predetermined correction data bit of "00000" as a next code word to the delay circuit 204. The function of the control gate 216 will be described later.

The delay circuit 204 delays the next code word to thereby provide a delayed next code word to the shift register 206. The delayed next code word is stored in the shift register 206 as an updated current code word of five bits and a code word previously stored therein is fed to the delay circuit 208 and the corrector 212 as a current code word of five bits. The delay circuit 208 delays the current code word to thereby provide a delayed current code word to be stored in the shift register 210. A code word previously stored in the shift register 210 is fed to the corrector 214 as a past code word of five bits.

The corrector 212 corrects the current code word fed thereto by changing all the 1's into 0's except the "1" in the least significant bit among the 1's, e.g., the "1" expressing a bit having the greatest subscript index thereof in the current code word if the current code word has two or more 1's to thereby provide a corrected current code word $C_4C_3C_2C_1C_0$. If the current code word has no or one 1, the corrector 212 provides the current code word as a corrected current code word $C_4C_3C_2C_1C_0$. The corrected current code word $C_4C_3C_2C_1C_0$ from the corrector 212 is fed to the control gate 216, the first decoding circuit 218 and the second decoding circuit 220.

Similarly, the corrector 214 corrects the past code word inputted thereto by changing all the 1's into 0's except the "1" at the least significant bit among the 1's, e.g., "1" expressing a bit having the greatest subscript index thereof in the past code word if the past code word has two or more 1's to thereby provide a corrected past code word $P_4P_3P_2P_1P_0$. If the past code word has no or one 1, the corrector 214 provides the past code word as a corrected past code word $P_4P_3P_2P_1P_0$. The corrected past code word $P_4P_3P_2P_1P_0$ from the corrector 214 is fed to the second decoding circuit 220.

If there is no error in the transmission of the encoded data, e.g., the output data $O_4O_3O_2O_1O_0$ of five bits from the coding apparatus 100 to the decoding apparatus 200 through a transmission channel, no abnormal five bit data having two or more 1's therein can be inputted to the decoding apparatus 200. But, if there is a transmission error, abnormal binary data, e.g., "01100", having two or more 1's therein may be fed to the decoding apparatus 200. For this reason, therefore, the correctors 212 and 214 are needed to correct the current code word and the past code word, respectively.

Figure 3:
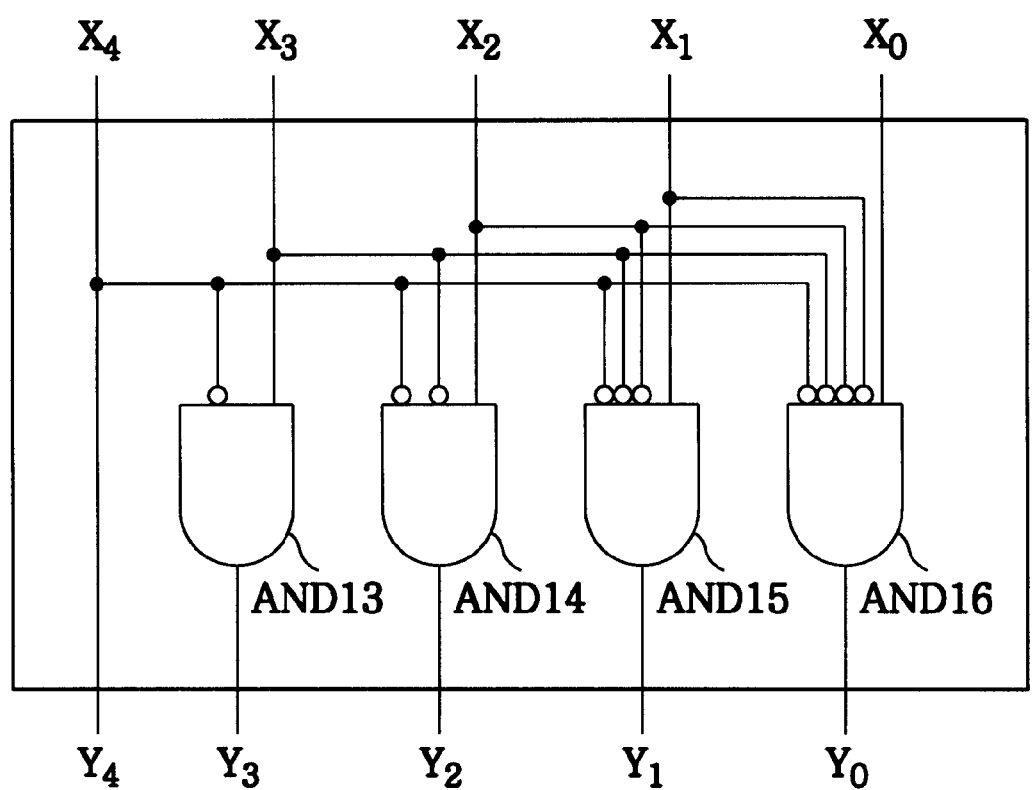
FIG. 3 depicts a circuit diagram of a corrector in the decoding apparatus shown in FIG. 2 in accordance with the preferred embodiment of the present invention.

Referring to FIG. 3, there is depicted a circuit diagram of the corrector 212 in the decoding apparatus 200 in accordance with the preferred embodiment of the present invention. The corrector 212 has four logic AND gates AND13, AND14, AND15 and AND16. In the corrector 212, an input code word $X_4X_3X_2X_1X_0$, e.g., the current code word is corrected as a corresponding corrected current code word $Y_4Y_3Y_2Y_1Y_0$, e.g., $C_4C_3C_2C_1C_0$.

In detail, $X_4$ is directly outputted as $Y_4$ and inputted to first inverted input ports of the AND gates AND13, AND14, AND15 and AND16. $X_3$ is inputted to a second input port of the AND gate AND13 and to second inverted input ports of the AND gates AND14, AND15 and AND16. $X_2$ is inputted to a third input port of the AND gate AND14 and to third inverted input ports of the AND gates AND15 and AND16. $X_1$ is inputted to a fourth input port of the AND gate AND15 and to a fourth inverted input port of the AND gate AND16. $X_0$ is inputted to a fifth input port of the AND gate AND16.

The AND gate AND13 performs AND operation on $X_3$ and an inverted value of $X_4$ to thereby output $Y_3$. The AND gate AND14 carries out AND operation on $X_2$ and inverted values of $X_3$ and $X_4$ to thereby output $Y_2$. The AND gate AND15 executes AND operation on $X_1$ and inverted values of $X_2$, $X_3$ and $X_4$ to thereby output $Y_1$. The AND gate AND16 performs AND operation on $X_0$ and inverted values of $X_1$, $X_2$, $X_3$ and $X_4$ to thereby output $Y_0$.

For example, if an input code word of "00110" is inputted to the corrector 212, the corrector 212 generates a corresponding corrected code word of "00100". It should be noted that the description for the structure and function of the corrector 214 is omitted for simplicity since the corrector 214 is the same as the corrector 212.

Referring back to FIG. 2, the corrected current code word $C_4C_3C_2C_1C_0$ is fed to the control gate 216. The control gate 216 provides a first control signal, e.g., 1, as an updated preset control signal commanding the MUX 202 to output "00000" if the corrected current code word $C_4C_3C_2C_1C_0$ is "00001" and a second control signal, e.g., 0, as an updated preset control signal commanding the MUX 202 to output the current encoded data if otherwise, respectively.

For example, the control gate 216 may be an AND gate having four inverted input ports and one input port as depicted in FIG. 2. In this case, when the corrected current code word is expressed as $C_4C_3C_2C_1C_0$, $C_0$ and inverted values of $C_4$, $C_3$, $C_2$ and $C_1$ are AND operated in the control gate 216. Hence, if the corrected current code word is "00001", the control gate 216 outputs "1" as a first control signal to the MUX 202; and outputs "0" as a second control signal to the MUX 202 if otherwise. Then, the MUX outputs "00000" if the first control signal "1" is inputted thereto; and outputs the encoded data if the second control signal "0" is inputted thereto.

For example, if a current code word is "00001" and a next code word is not "00000", it is deduced that at least one of the current code word and the next code word has an error. In this case, the error occurrence probability in the next code word is estimated to be higher than that in the current code word. Accordingly, in this respect, the decoding apparatus 200 has been designed in such a way that if a current code word is "00001", a next code word becomes "00000" by employing the control gate 216.

The first decoding circuit 218 has an OR gate OR1 and three AND gates AND7, AND8 and AND9. In the first decoding circuit 218, $C_2$ and inverted values of $C_4$, $C_3$, $C_1$ and $C_0$ are AND operated in the AND gate AND7; $C_1$ and inverted values of $C_4$, $C_3$, $C_2$ and $C_0$ are AND operated in the AND gate AND8; and $C_0$ and inverted values of $C_4$, $C_3$, $C_2$ and $C_1$ are AND operated in the AND gate AND9. The outputs of the AND gates AND7, AND8 and AND9 are inputted to corresponding input ports of the OR gate OR1, respectively, as shown in FIG. 2.

The second decoding circuit 220 has an OR gate OR2 and three AND gates AND10, AND11 and AND12. In the second decoding circuit 220, $C_3$ and inverted values of $C_4$, $C_2$, $C_1$ and $C_0$ are AND operated in the AND gate AND10; and $C_2$ and inverted values of $C_4$, $C_3$, $C_1$ and $C_0$ are AND operated in the AND gate AND11; and $P_0$ and inverted values of $P_4$, $P_3$, $P_2$ and $P_1$ are AND operated in the AND gate AND12. The outputs of the AND gates AND10, AND11 and AND12 are inputted to corresponding input ports of the OR gate OR2, respectively, as shown in FIG. 2.

The OR gate OR1 performs OR operation on the three outputs from the AND gates AND7, AND8 and AND9 to thereby provide a first OR output. The OR gate OR2 performs OR operation on the three outputs from the AND gates AND10, AND11 and AND12 to thereby provide a second OR output. The first OR output and the second OR output are registered in corresponding memory locations relating to $O_0$ and $O_1$, respectively, of the data output buffer 222 as shown in FIG. 2.

The data output buffer 222, in response to a two bit data output clock signal fed thereto from the divider 224, provides corresponding output data $O_1O_0$ of two bits inputted thereto from the first and second decoding circuits 218 and 220 as reconstructed data, wherein the two bit data output clock signal is obtained by dividing the predetermined clock signal CLK by 5 through the divider 224.

For the output data $O_0$ from the first decoding circuit 218, $O_0=1$ if $C_4C_3C_2C_1C_0$ is one of "001000", "00010" and "00001"; and $O_0=0$ if otherwise. For the output data $O_1$ from the second decoding circuit 220, $O_1=1$ if $P_4P_3P_2P_1P_0$ is "00001" or $C_4C_3C_2C_1C_0$ is one of "010000" and "00010"; and $O_1=0$ if otherwise.

While the present invention has been described with respect to certain preferred embodiments only, other modifications and variations may be made without departing from the scope and spirit of the present invention as set forth in the following claims.

What is claimed is:

1. A run-length limited encoding method used in an optical data storage system for encoding input data of two bits into corresponding output data of five bits,
   wherein a minimum run-length of zeroes (0's) in a stream of the output data is 3;
   a maximum run-length of zeroes (0's) in the stream of the output data is 11; and
   the number of 1 included in binary numbers of five bits expressing the corresponding output data is 1 or 0.

2. The method according to claim 1, wherein the input data of two bits is one of "00", "01", "10" and "11"; and the corresponding output data of five bits is one of "10000", "01000", "00100" and "00010".

3. The method according to claim 1, wherein the input data of "00", "01", "10" and "11" are encoded into the corresponding output data of "10000", "01000", "00100" and "00010", respectively.

4. The method according to claim 3, wherein if a pair of consecutive two input data is "1000", a pair of corresponding two output data is determined as "0010000000"; if a pair of consecutive two input data is "1100", a pair of corresponding two output data is determined as "0001000000"; and if a pair of consecutive two input data is "1101", a pair of corresponding two output data is determined as "0000100000".

5. A run-length limited encoding apparatus used in an optical data storage system for encoding current input data $C_1C_0$ of two bits into corresponding current output data $O_4O_3O_2O_1O_0$ of five bits, comprising:

a first shift register for storing updated next input data of two bits inputted thereto in response to a predetermined clock signal CLK and for providing data of two bits previously stored therein as next input data $N_1N_0$ of two bits;

a first delay circuit for delaying the next input data $N_1N_0$ to thereby generate updated current input data;

a second shift register for storing the updated current input data inputted thereto and for providing data of two bits previously stored therein as current input data $C_1C_0$ of two bits;

a second delay circuit for delaying the current input data $C_1C_0$ of two bits to thereby generate updated past input data;

a third shift register for storing the updated past input data inputted thereto and for providing data of two bits previously stored therein as past input data $P_1P_0$ of two bits;

an encoding circuit for encoding the current input data $C_1C_0$ of two bits into corresponding current output data $O_4O_3O_2O_1O_0$ of five bits by using the past input data $P_1P_0$, the current input data $C_1C_0$ and the next input data $N_1N_0$, wherein a minimum run-length of zeroes (0's) in a stream of the output data is 3; a maximum run-length of zeroes (0's) in the stream of the output data is 11; and the number of 1 included in binary numbers of five bits expressing the output data is 1 or 0;

a divider for dividing the predetermined clock signal CLK by 2 to thereby provide a five bit data output clock signal; and a data output buffer circuit, in response to the five bit data output clock signal, for generating the corresponding output data $O_4O_3O_2O_1O_0$ of five bits.

6. The apparatus according to claim 5, wherein the encoding circuit has:

a NAND gate NAND1 for executing NAND operation on $P_1$ and an inverted value of $P_0$;

an AND gate AND1 for performing AND operation on $N_0$ and an inverted value of $N_1$;

an AND gate AND2 for carrying out AND operation on inverted values of $P_1$, $C_1$ and $C_0$;

an AND gate AND3 for executing AND operation on $C_0$, an inverted value of $C_1$ and an inverted value of an output of the NAND gate NAND1;

an AND gate AND4 for performing AND operation on $C_1$ and $C_0$;

an AND gate AND5 for executing AND operation on $C_1$ and inverted values of $C_0$ and an output value of the AND gate AND1; and an AND gate AND6 for performing AND operation on $C_1$, an output value of the AND gate AND1 and an inverted value of $C_0$.

7. A run-length limited decoding apparatus used in an optical data storage system for decoding current encoded data of five bits into reconstructed current data $O_1O_0$ of two bits, the current encoded data of five bits being obtained by encoding corresponding current input data of two bits through the use of the encoding method of claim 4, the decoding apparatus comprising:

a multiplexer (MUX), in response to a preset control signal, for performing multiplexing on the current encoded data and predetermined correction data of "00000" to thereby provide one of the current encoded data and the predetermined correction data of "00000" as a next code word of five bits;

a first delay circuit for delaying the next code word to thereby provide a delayed next code word;

a first shift register for storing the delayed next code word as an updated current code word of five bits and for feeding a code word previously stored therein as a current code word;

a second delay circuit for delaying the current code word to thereby provide a delayed current code word;

a second shift register for storing the delayed current code word as an updated previous code word of five bits and for feeding a code word previously stored therein as a previous code word;

a first corrector for providing the current code word as a corrected current code word $C_4C_3C_2C_1C_0$ of five bits if the current code word has no or one 1 and for correcting the current code word by changing all the 1's into 0's except the "1" in the least significant bit among the 1's if the current code word has two or more 1's to thereby provide a corrected current code word $C_4C_3C_2C_1C_0$ of five bits;

a second corrector for providing the past code word as a corrected past code word $P_4P_3P_2P_1P_0$ of five bits if the past code word has no or one 1 and for correcting the past code word by changing all the 1's into 0's except the "1" in the least significant bit among the 1's if the past code word has two or more 1's to thereby provide a corrected past code word $P_4P_3P_2P_1P_0$ of five bits;

a control gate for providing a first control signal as an updated preset control signal commanding the MUX to output "00000" if the corrected current code word is "00001" and a second control signal as an updated preset control signal commanding the MUX to output the current encoded data if otherwise, respectively;

a first decoding circuit, based on the corrected current code word $C_4C_3C_2C_1C_0$, for generating 1 as $O_0$ if $C_4C_3C_2C_1C_0$ is one of "00100", "00010" and "00001" and 0 as $O_0$ if otherwise, respectively;

a second decoding circuit, based on the corrected current code word $C_4C_3C_2C_1C_0$ and the corrected past code word $P_4P_3P_2P_1P_0$, for generating 1 as $O_1$ if $P_4P_3P_2P_1P_0$ is "00001" or $C_4C_3C_2C_1C_0$ is "01000" or "00010" and 0 as $O_1$ if otherwise, respectively;

a divider for dividing the predetermined clock signal CLK by 5 to thereby provide a two bit data output clock signal; and a data output buffer, in response to the two bit data output clock signal, for generating the corresponding output data $O_1O_0$ of two bits inputted thereto from the first and the second encoding circuits.

8. The decoding apparatus of claim 7, wherein the first decoding circuit includes:

an AND gate for performing AND operation on $C_2$ and inverted values of $C_4$, $C_3$, $C_1$ and $C_0$ to thereby output a first AND output;

an AND gate for performing AND operation on $C_1$ and inverted values of $C_4$, $C_3$, $C_2$ and $C_0$ to thereby output a second AND output;

an AND gate for performing AND operation on $C_0$ and inverted values of $C_4$, $C_3$, $C_2$ and $C_1$ to thereby output a third AND output; and an OR gate for performing OR operation on the first, the second and the third AND outputs to thereby generate a first OR output as the value of $O_0$.

9. The decoding apparatus of claim 7, wherein the second decoding circuit includes:

an AND gate for performing AND operation on $C_3$ and inverted values of $C_4$, $C_2$, $C_1$ and $C_0$ to thereby output a fourth AND output;

an AND gate for performing AND operation on $C_2$ and inverted values of $C_4$, $C_3$, $C_1$ and $C_0$ to thereby output a fifth AND output;

an AND gate for performing AND operation on $P_0$ and inverted values of $P_4$, $P_3$, $P_2$, and $P_1$ to thereby output a sixth AND output; and an OR gate for performing OR operation on the fourth, the fifth and the sixth AND outputs to thereby generate a second OR output as the value of $O_1$.

10. The decoding apparatus of claim 7, wherein the first corrector for correcting the current code word of five bits, which is referred to as $X_4X_3X_2X_1X_0$, into the corrected current code word $C_4C_3C_2C_1C_0$ includes:

an AND gate for performing AND operation on $X_3$ and an inverted value of $X_4$ to thereby output $C_3$;

an AND gate for performing AND operation on $X_2$ and inverted values of $X_3$ and $X_4$ to thereby output $C_2$;

an AND gate for performing AND operation on $X_1$ and inverted values of $X_2$, $X_3$ and $X_4$ to thereby output $C_1$; and an AND gate for performing AND operation on $X_0$ and inverted values of $X_1$, $X_2$, $X_3$ and $X_4$ to thereby output $C_0$, wherein $X_4$ is directly outputted as $C_4$.

* * * * *